United States Patent [19]

Utz

[11] Patent Number: 5,481,222

[45] Date of Patent: Jan. 2, 1996

[54] POWER CONSERVING INTEGRATED CIRCUIT

[75] Inventor: Hubert Utz, Munich, Germany

[73] Assignee: National Semiconductor Corporation, Santa Clara, Calif.

[21] Appl. No.: 6,665

[22] Filed: Jan. 19, 1993

Related U.S. Application Data

[63] Continuation of Ser. No. 813,113, Dec. 23, 1991, abandoned.

[51] Int. Cl.⁶ ........................................ H02J 1/00
[52] U.S. Cl. .......................... 327/544; 327/392; 327/398; 377/31
[58] Field of Search .............................. 307/590, 592, 307/595, 597, 600, 296.1, 296.3; 364/707; 365/227; 377/31, 32; 327/392, 393, 395, 398, 530, 544

[56] References Cited

U.S. PATENT DOCUMENTS

| | | | |
|---|---|---|---|
| 3,559,072 | 1/1971 | Davisson | 307/597 |
| 3,621,276 | 11/1971 | Mitchell | 361/18 |
| 3,719,836 | 3/1973 | Possell | 307/301 |
| 3,965,743 | 6/1976 | Turner | 368/11 |
| 4,107,553 | 8/1978 | Carter | 307/597 |
| 4,112,764 | 9/1978 | Turner | 307/597 |
| 4,174,541 | 11/1979 | Schmitz | 365/227 |
| 4,250,413 | 2/1981 | Kawasaki et al. | 307/597 |
| 4,274,034 | 6/1981 | Conklin | 307/296.3 |
| 4,288,831 | 9/1981 | Dolikian | 307/296.3 |
| 4,381,552 | 4/1983 | Nocilini et al. | |
| 4,463,646 | 8/1984 | Mitarai | 307/31 |
| 4,538,074 | 8/1985 | Fraden | 307/597 |
| 4,598,383 | 7/1986 | Leach | 365/227 |
| 4,698,748 | 10/1987 | Juzswik et al. | 364/200 |
| 4,964,121 | 10/1990 | Moore | 340/825.44 |
| 4,999,516 | 3/1991 | Suter et al. | 307/296.3 |
| 5,095,308 | 3/1992 | Hewitt | 324/433 |
| 5,184,031 | 2/1993 | Hayakawa et al. | 307/296.3 |

*Primary Examiner*—Terry Cunningham
*Attorney, Agent, or Firm*—Flehr, Hohbach, Test, Albritton & Herbert

[57] ABSTRACT

A power conserving integrated circuit is disclosed. The integrated circuit is coupled to its external power supply only in response to an external event. An initial power connection is made in response to the external event. An element on the integrated circuit detects the initial power connection. After detecting the initial power connection, a switch internal to the integrated circuit is closed so as to couple the power supply to the integrated circuit for a predetermined period of time sufficient for a function to be executed by the integrated circuit. Afterwards, the connection is terminated and is not re-initiated until another external event. Therefore, power is consumed only when necessary, thereby preserving the power source.

8 Claims, 2 Drawing Sheets

POWER CONSERVING INTEGRATED CIRCUIT

This is a continuation of application Ser. No. 07/813,113 filed Dec. 23, 1991, now abandoned.

This invention generally relates to minimizing the power consumption of an integrated circuit. More particularly, this invention relates to an integrated circuit which conserves power by utilizing power only in the limited time immediately after an external event and a predetermined period thereafter.

BACKGROUND OF THE INVENTION

An integrated circuit or chip relies upon an external power source to perform its intended function. Typically, the external power source continuously provides power to the chip, even though the chip may not require the power at all times. As a result, the power source may be unnecessarily depleted, as in the case of a battery. Preserving battery power is extremely important in many electronic applications. Prior art attempts to preserve battery power rely upon components external to the chip. These components are relatively expensive and inconvenient to install.

OBJECTS AND SUMMARY OF THE INVENTION

Thus, it is a general object of the present invention to provide a method and apparatus for limiting the power consumed by integrated circuits.

It is a related object of the present invention to provide an integrated circuit which consumes power only when required, that is, in the limited time immediately after an external event and a predetermined period thereafter.

These and other objects are achieved by a power conserving integrated circuit. The integrated circuit is coupled to its external power supply only in response to an external event. An initial power connection is made in response to the external event. An element on the integrated circuit detects the initial power connection. After detecting the initial power connection, a switch internal to the integrated circuit is closed so as to couple the power supply to the integrated circuit for a predetermined period of time sufficient for a function to be executed by the integrated circuit. Afterwards, the connection is terminated and is not re-initiated until another external event. Therefore, power is consumed only when necessary, thereby preserving the power source.

BRIEF DESCRIPTION OF THE DRAWINGS

Additional objects and features of the invention will be more readily apparent from the following detailed description and appended claims when taken in conjunction with the drawings, in which:

DETAILED DESCRIPTION OF THE INVENTION

Figure 1:
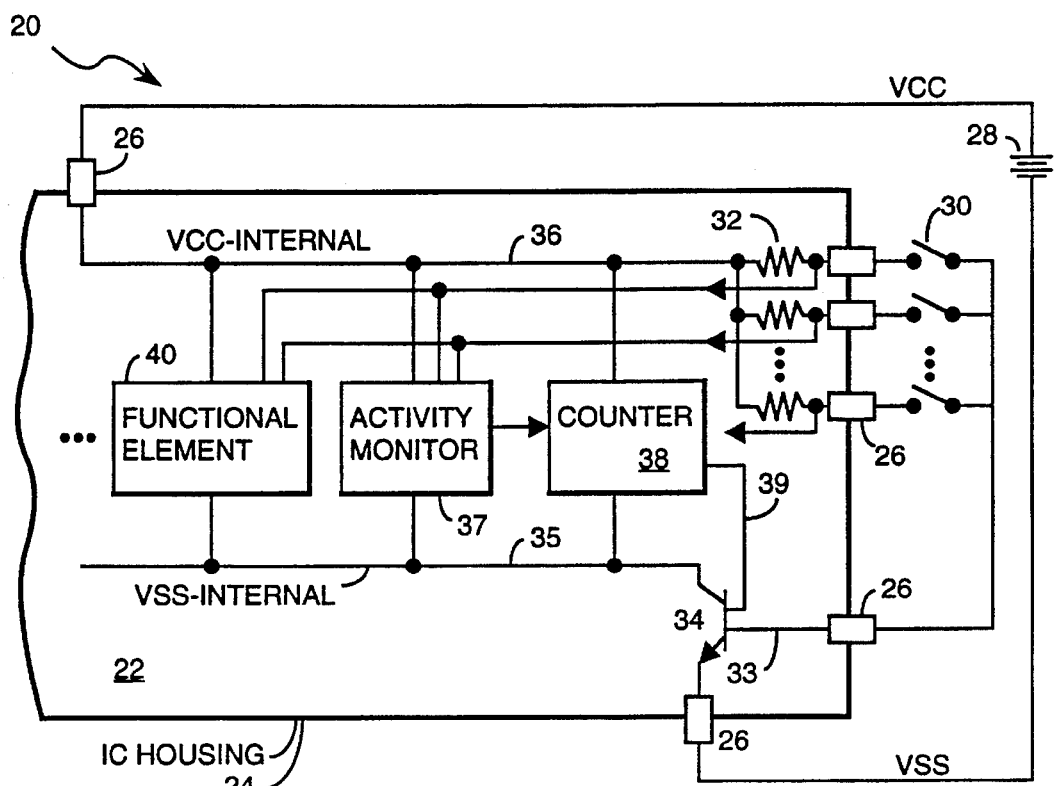
FIG. 1 which depicts a power conserving integrated circuit in accordance with the present invention.

Referring to FIG. 1, a power conserving integrated circuit package 20 in accordance with the present invention is depicted. The package 20 includes an integrated circuit or chip 22 positioned within a housing 24. Housing 24 includes a plurality of pins 26 for coupling the integrated circuit 22 to external components. The external components send input signals to the integrated circuit 22. In response to the input signals, the integrated circuit 22 performs some function and generates output signals. Integrated circuit 22 is powered by a battery 28 which is coupled through pins 26.

In accordance with prior art techniques, battery 28 constantly provides power to the integrated circuit 22. This approach is problematic in that a constant power supply is provided while for most integrated circuits only intermittent power is required. As a result, power from the battery 28 is unnecessarily depleted. In almost all circumstances, conservation of battery power is highly beneficial.

These problems are avoided in accordance with the teachings of the present invention. With the present invention, power is consumed intermittently: immediately after an external event and for a predetermined period thereafter. Consequently, power is only consumed when it is necessary; that is, power is consumed only when the integrated circuit 22 is executing a function. With the present invention, power consumption control is governed on board the chip, therefore, external components are not required to limit power consumption.

The benefits of this invention may be realized in the following manner. A plurality of switches 30 are coupled to the package 20 through pins 26. The switches monitor external events. An external event may be the touching of a button, a signal from an external circuit, or other analogous event occurring outside of the package 20. When an external event occurs which requires activity from integrated circuit 22, one of the switches 30 is momentarily closed and a closed circuit is formed from VCC to VSS through resistor 32, switch 30, line 33 and then NPN transistor 34.

Transistor 34 is a switch internal to the chip 22 that enables power to be connected or provided to the internal circuitry of chip 22. When transistor 34 is open, the chip's internal VSS node 35 is left floating, and therefore will rise to approximately the same potential as the VCC node 36. When transistor 34 is closed, current flows through the transistor so as to maintain the VSS internal node 35 at approximately the same voltage potential as the VSS low potential node of battery 28. As will be understood by those skilled in the art, for MOS and CMOS integrated circuits, NPN transistor 34 would be replaced by either an NMOS transistor gated by lines 33 and 39, or a pair of complementary NMOS/PMOS transistors gated by the same signals and their complements.

The external activity which closes one of the switches 30 creates an initial connection which causes the transistor 34 to be turned on. Once the transistor 34 is turned on, node 35 is pulled low, allowing the circuitry inside the chip 22 to operate. This transition from a dormant to an active state is detected by activity monitor 37. Activity monitor 37 may be a transistor or other element which senses the presence of a current flowing through a transistor. Activity monitor 37 initializes counter 38 whenever a transition from a dormant to an active state is detected. As shown, signals derived from the external events will also be used by circuits internal to the chip 22.

The counter 38 outputs a signal on line 39 which enables a current to be provided to the base of transistor 34 for the predetermined period of time defined by the counter 38. Counter 38 will typically be a down counter that decrements from an initial value at a rate determined by an internally generated clock signal (not shown). Alternately, the counter 38 may be replaced with an RC circuit, having a predetermined decay rate, with a comparator which shuts off the supply of current to line 39 when an initial voltage level falls below a threshold level.

The "second power connection" provided via line 39 is needed to maintain power to the chip's internal circuitry because the switch 30 will toggle to its open position after being activated, which would cut the initial power connection to the chip. The second power connection effectively eliminates the problem of switch bouncing.

Transistor 34 will remain on during the duration of the period defined by the counter 38. As a result, power from the battery 28 will be available to any functional element 40 on the integrated circuit 22 during this period of time. Consequently, power will be available to the integrated circuit 22 from the time of an external event until a predetermined period thereafter as defined by the counter 38. This period of time will be sufficient to complete the function to be performed by the integrated circuit 22.

In the preferred embodiment, activity monitor 37 monitors at least some of the input event signals associated with switches 30, and resets counter 38 to its starting value each time that an external event signal is received. In this way, power will continue to be provided to the chip's internal circuitry until a predefined amount of time has elapsed after the last received event signal. This method of operation can be used to ensure that all event signals are processed before power to the chip is shut off, or to prevent unnecessary power-up and down cycles when a quick succession of external event signals are received.

Figure 2:
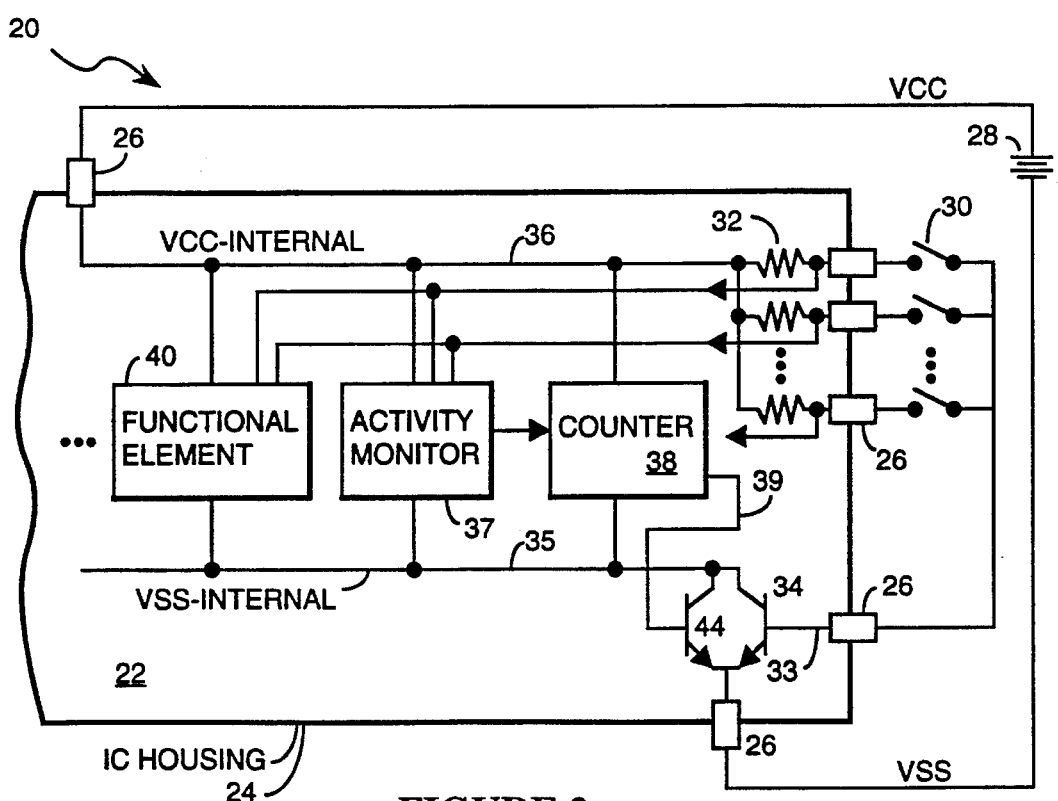
FIG. 2 depicts an alternate embodiment of the circuit of FIG. 1.

Referring to FIG. 2, in an alternate embodiment, transistor 34 is replaced by two switches or transistors 34 and 44. Transistor 34 forms the initial power connection whenever an external event signal is received, and transistor 44 is enabled by the counter's output signal on line 39 so as to maintain power to the chip 22 for a predetermined period of time. In either embodiment, the power is drawn from battery 28 only when required. This preserves the power in the battery.

Figure 3:
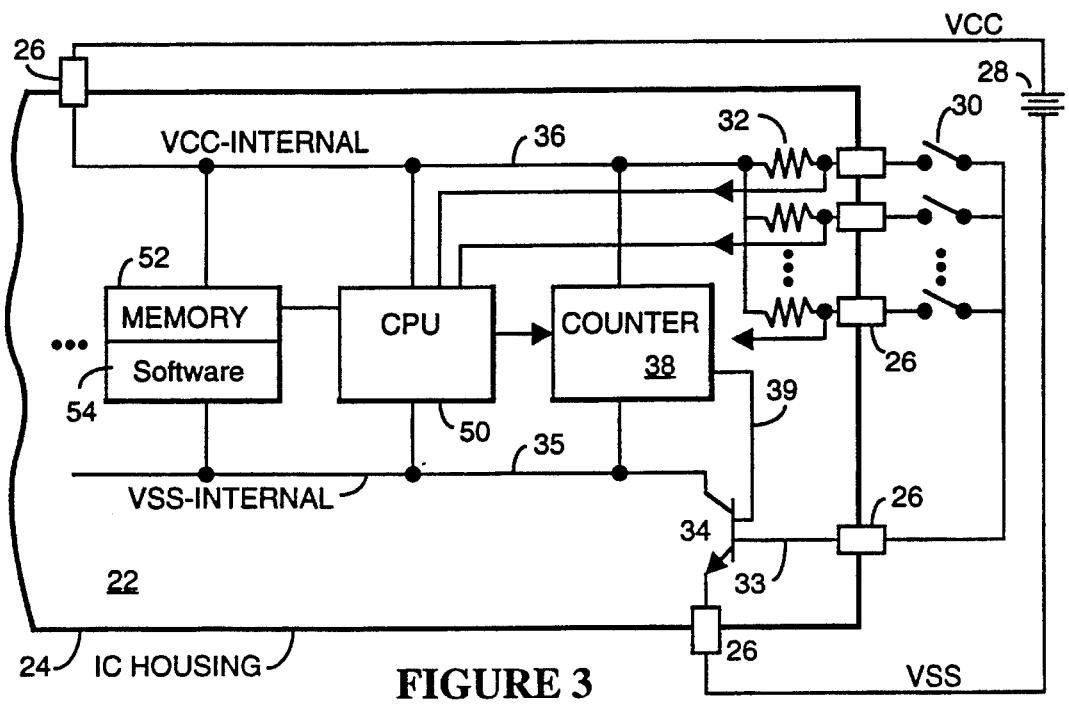
FIG. 3 depicts an alternate embodiment of the circuit of FIG. 1 which utilizes software for retriggering the counter.

FIG. 3 depicts an alternate embodiment of the invention wherein the counter is reset by a software switch or trigger. Specifically, in the embodiment of FIG. 3, a CPU circuit 50 senses transistions of the circuit 22 from a dormant to an active state, and when such a transistion is detected it sends a reset signal to counter 38. As in above described embodiments, counter 38 maintains the circuit's power connection for a predetermined amount of time each time that it is reset. The CPU circuit 50 also monitors at least some of the input event signals associated with switches 30 and resets counter 38 to its starting value each time that an external event signal is received.

In addition, the CPU 50 relies upon memory 52 and stored software 54 to execute a given function. If the software 54 is executing a function which will not be completed in the period defined by the counter 38, then the software must include one or more in-line "counter reset" instructions to reset the counter 38. Each "counter reset" instruction in the software 54 causes CPU 50 to transmit a reset signal to the counter 38. As a result, power will be supplied to the chip 20 for a period sufficient to execute the given software function.

Figure 4A:
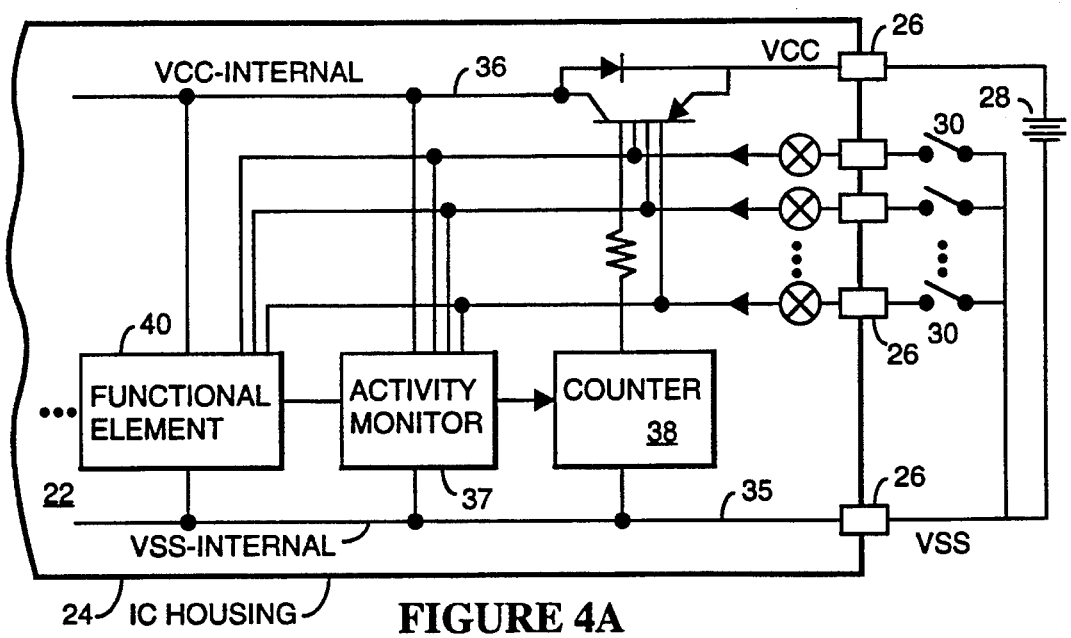
FIGS. 4A and 4B depict an alternate embodiment of the present invention which includes Vcc switching.
Figure 4B:
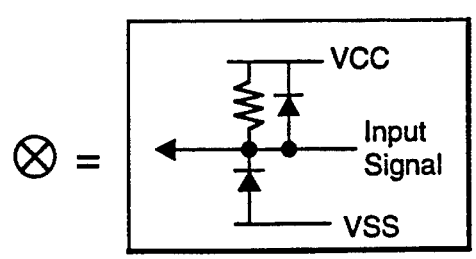

The embodiments disclosed herein switch ground or Vss. One skilled in the art will recognize that alternate embodiments are possible which entail switching Vcc. One suitable embodiment is disclosed in FIGS. 4A and 4B.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A power conserving integrated circuit comprising:

a power supply terminal for coupling to an external power supply;

a plurality of signal terminals for receiving externally derived event signals;

circuitry coupled to said power supply terminal by an integrated switch;

said integrated switch, coupled to said plurality of signal terminals, for coupling said circuitry to said power supply terminal in response to an initial one of said externally derived event signals received on any one of said plurality of signal terminals, said circuitry being dormant when said circuitry is not coupled to said power supply terminal;

said circuitry including an activity monitoring circuit for detecting said coupling of said circuitry to said power supply terminal; and said circuitry including timing circuit, responsive to said activity monitoring means, for maintaining said integrated switch in a closed state so as to maintain a connection between said power supply terminal and said circuitry for a predetermined period after said initial, externally derived event signal, and for releasing said connection so that said circuitry returns to dormancy.

2. The device of claim 1 wherein said timing circuit includes a counter that updates an internally stored value at a rate determined by a clock signal of predetermined frequency and outputs to said integrated switch a switch enabling signal during said predetermined period so as to maintain said integrated switch in said closed state.

3. The device of claim 2 wherein said activity monitoring circuit includes means for re-initializing said counter in response to a second one of said externally derived event signals, whereby said integrated switch maintains a connection between said power supply terminal and said circuitry until said predetermined period has passed since said second event signal.

4. The device of claim 2 wherein said activity monitoring circuit further includes digitally programmable means for initializing and re-initializing said counter to a predefined count value.

5. A power conserving integrated circuit comprising:

a power supply terminal for coupling to an external power supply;

circuitry coupled to said power terminal;

integrated switch means for coupling said circuitry to said power supply terminal only in response to an externally derived event signal, said coupling of said power supply terminal to said circuitry creating an initial power connection;

activity monitoring means, coupled to said circuitry, for detecting said initial power connection;

secondary means, responsive to said activity monitoring means, also for coupling said power supply terminal to said circuitry for a predetermined period, said secondary means creating a second power connection prior to loss of said initial power connection, said secondary means further including a means for restarting said predetermined period, prior to termination thereof, in response to a subsequent externally derived event signal so as to maintain said coupling after said subsequent event signal for said predetermined period.

6. The apparatus of claim 5 wherein said integrated switch means includes at least one semiconductor switch.

7. The apparatus of claim 6 wherein said secondary means includes a counter.

8. The device of claim 1 wherein said timing circuit includes a counter that increments or decrements an internally stored value at a rate determined by a clock signal of predetermined frequency.

\* \* \* \* \*